(12) United States Patent
Lie et al.

(10) Patent No.: US 12,494,408 B2
(45) Date of Patent: Dec. 9, 2025

(54) DOUBLE PATTERNED MICROCOOLER HAVING ALTERNATING FIN WIDTHS

(71) Applicant: International Business Machines Corporation, Armonk, NY (US)

(72) Inventors: Fee Li Lie, Albany, NY (US); Sagarika Mukesh, Albany, NY (US); Devika Sarkar Grant, Rensselaer, NY (US); Hosadurga Shobha, Niskayuna, NY (US); Thamarai Selvi Devarajan, Niskayuna, NY (US); Kamal K. Sikka, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 759 days.

(21) Appl. No.: 17/455,949

(22) Filed: Nov. 22, 2021

(65) Prior Publication Data
US 2023/0163039 A1    May 25, 2023

(51) Int. Cl.
*H01L 23/367* (2006.01)
*H01L 21/48* (2006.01)
*H01L 23/373* (2006.01)
*H01L 23/473* (2006.01)

(52) U.S. Cl.
CPC ...... *H01L 23/3672* (2013.01); *H01L 21/4882* (2013.01); *H01L 23/3735* (2013.01); *H01L 23/473* (2013.01)

(58) Field of Classification Search
CPC .......... H01L 23/3672; H01L 23/473; H01L 21/4871
See application file for complete search history.

(56) References Cited

U.S. PATENT DOCUMENTS

| | | | | |
|---|---|---|---|---|
| 5,042,257 A | * | 8/1991 | Kendrick | F28F 3/048 62/3.1 |
| 5,317,805 A | | 6/1994 | Hoopman | |
| 5,482,113 A | | 1/1996 | Agonafer | |
| 5,838,065 A | * | 11/1998 | Hamburgen | H01L 23/3738 257/722 |
| 5,937,517 A | * | 8/1999 | Smith | B23P 15/26 257/E23.105 |
| 6,138,352 A | * | 10/2000 | Smith | H01L 21/4882 257/E23.103 |
| 7,109,581 B2 | | 9/2006 | Dangelo | |
| 7,301,210 B2 | | 11/2007 | Abadeer | |

(Continued)

FOREIGN PATENT DOCUMENTS

EP    0641155 A1    3/1995
WO    2005060738 A1    7/2005

OTHER PUBLICATIONS

"Compatible Materials for Electroplated Aluminum", AlumiPlate, downloaded from the Internet on Aug. 19, 2021, <https://www.alumiplate.com/coating/materials-plated>, 6 pages.

(Continued)

*Primary Examiner* — Sherman Ng
(74) *Attorney, Agent, or Firm* — Aaron N. Pontikos

(57) ABSTRACT

A microcooler device and formation thereof. The microcooler device includes: a first set of fins having a first fin width; a second set of fins having a second fin width, wherein the first set of fins alternate between the second set of fins; and a set of channels located between the first set of fins and the second set of fins.

16 Claims, 3 Drawing Sheets

(56) References Cited

U.S. PATENT DOCUMENTS

| | | | |
|---|---|---|---|
| 9,818,726 B2 | 11/2017 | Chainer | |
| 10,490,481 B1* | 11/2019 | Lie | H01L 23/3735 |
| 10,553,522 B1 | 2/2020 | Canaperi | |
| 2005/0141195 A1 | 6/2005 | Pokharna | |
| 2005/0189568 A1* | 9/2005 | Colgan | H01L 23/367 |
| | | | 257/E23.102 |
| 2007/0121299 A1* | 5/2007 | Campbell | H01L 23/4735 |
| | | | 257/E23.098 |
| 2016/0178289 A1* | 6/2016 | Gonzalez | H01L 23/467 |
| | | | 165/80.3 |

OTHER PUBLICATIONS

"Electroless Nickel Plating: A general description of electroless nickel plating and its effect on Bal Seal® spring-energized seal performance in reciprocating and rotary service", Technical Report TR-16 (Rev. E; Jul. 27, 2016) (100-63-4), 11 pages, <https://www.balseal.com/wp-content/uploads/2019/03effects_of_electroless_nickel_plating_on_reciprocating_and_rotary_bal_sealTR_16.pdf>.
Williams et al., "Etch Rates for Micromachining Processing—Part II", Journal of Microelectromechanical Systems, vol. 12, No. 6, Dec. 2003, 18 pages.

* cited by examiner

DOUBLE PATTERNED MICROCOOLER HAVING ALTERNATING FIN WIDTHS

BACKGROUND OF THE INVENTION

The present invention relates generally to the field of copper microcoolers, and more particularly to double patterned copper microcoolers having alternating fin widths.

A microcooler is a cooling device that reduces the temperature of electronic components, such as integrated circuits (ICs) or processors. For example, a microcooler can be employed in a liquid cooling system, in which a coolant fluid is passed through the microcooler to maintain a temperature of one or more electronic components within a certain temperature range and/or to reduce a temperature of the one or more electronic components.

SUMMARY

According to one embodiment of the present invention, a microcooler device is provided. The microcooler device includes a first set of fins having a first fin width. The microcooler device further includes a second set of fins having a second fin width. The first set of fins alternate between the second set of fins. The microcooler device further includes a set of channels located between the first set of fins and the second set of fins.

According to another embodiment of the present invention, a method of forming a microcooler device is disclosed. The method includes forming a first set of fins in a copper substrate. Forming the first set of fins in the copper substrate further results in forming a first set of channels located between the first set of fins. The method further includes forming a second set of fins in the first set of channels. The first set of fins have a first fin width, and the second set of fins have a second fin width.

According to another embodiment of the present invention, a microcooler device is disclosed. The microcooler device includes a set of composite fins. The set of composite fins include a first material, and a second material formed on a surface of the first material. The microcooler further includes a set of channels located between the set of composite fins.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 1-6 illustrate both (i) copper microcooler devices and (ii) the methods for forming such copper microcooler devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
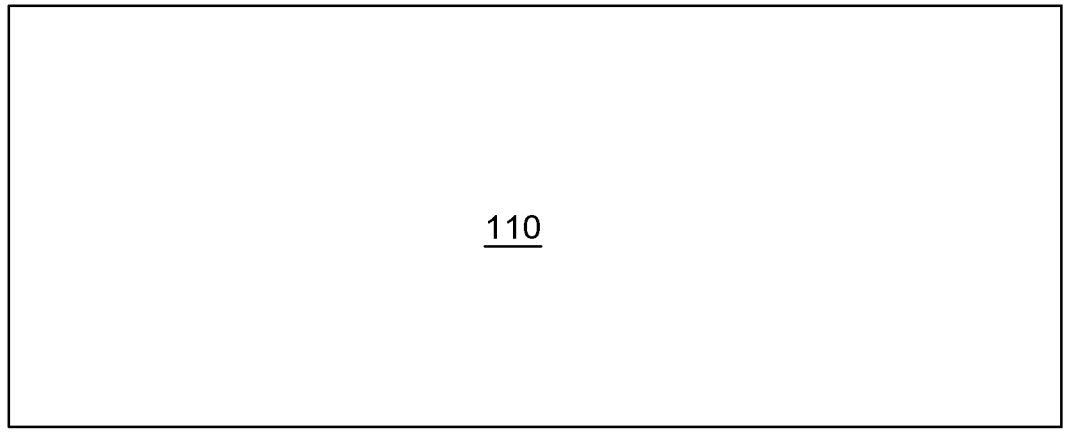
FIG. 1 illustrates a cross-sectional view depicting a substrate 110 used to form a microcooler device in accordance with at least one embodiment of the present invention.

Embodiments of the present invention provide for a double patterned copper microcooler device having alternating fin widths and methods of forming a double patterned copper microcooler device having alternating fin widths.

Embodiments of the present invention recognize that in order to reduce thermal resistance in current copper microcoolers, the channel/fin width can be reduced. For example, reducing the channel width from 250 um to 100 um and the fin width from 250 um to 50 um in a copper microcooler may result in approximately a 40 percent reduction in thermal resistance, up to a three degree gain in chip temperature for conventional shaped microcooler fins, and up to a six degree gain in chip temperature for unconventional shaped copper microcoolers (e.g., trapezoidal-shaped fins or pin-shaped fins). Such dimensions may be achieved via silicon/copper hybrid microcoolers, but at the increased cost of silicon processing and multiple wafer bonding. However, the ability to achieve such narrowed channel/fin widths in copper microcoolers is ultimately limited by current copper micromachining techniques.

Embodiments of the present invention provide for a copper microcooler device, and methods for forming a copper microcooler device that provide for improved thermal characteristics and reduced channel/fin widths as compared to conventional copper microcoolers fabricated by current copper micromachining techniques. By reducing the fin width of every other fin of a copper microcooler in accordance with embodiments of the present invention, the number of channels that can be formed within the same sized copper microcooler is increased nearly two-fold.

In an embodiment, a copper microcooler cooler is formed having alternating fin widths, thereby allowing for a copper microcooler having narrower channel widths (e.g., ~100 um) than can be achieved via current copper micromachining techniques. The copper microcooler is fabricated by forming (e.g., via micromachining) a first set of fins within a copper substrate. A first set of channels, located between the first set of fins, are also formed as a result of forming the first set of fins within the copper substrate. An alternative metal (other than copper) or alternative metal compound (that does not include copper) is then deposited on top of the surfaces of the first set of fins (and optionally onto a bottom surface of the first set of channels formed between the first set of fins). Copper is then deposited on top of the surfaces of the alternate metal or alternate metal compound formed on the surfaces of the first set of fins (and optionally onto the alternative metal if formed onto the bottom surface of the first set of channels) until the first set of channels are filled with copper. Excess copper deposited on top of the surfaces of the alternate metal or alternate metal compound is removed (e.g., via polishing) until the top surface of the first set of fins is exposed. The alternative metal or alternative metal compound is then selectively removed (e.g., via selective wet etching) to form a second set of fins that alternate between the first set of fins. As a result of the formation of a microcooler having alternating fin widths, a finer channel width (e.g., ~100 um) is achieved. By achieving narrower channel widths, the surface area of the copper microcooler of the present invention is increased, thereby reducing thermal resistance of neighboring electronic components.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-6, embodiments of the present invention include copper microcooler devices and methods of forming such copper microcooler devices, and in particular, copper microcooler devices having alternating fin widths. The methods described below in conjunction with FIGS. 1-6 may be incorporated into typical copper microcooler fabrication processes, such as fabrication processes. As such, when viewed as ordered combinations, FIGS. 1-6 illustrate methods for forming copper microcooler devices having alternating fin widths to achieve a narrower channel width, and thus improved thermal resistance of copper microcooler devices in accordance with illustrative embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures. FIGS. 1-6 include various cross-sectional views depicting illustrative steps of a method for manufacturing copper microcooler devices and the resulting copper microcooler devices according to select embodiments of the present invention. One having ordinary skill in the art will appreciate that there are many options available for the formation of the structures described herein and that the following discussion does not limit embodiments to only the techniques described herein.

Referring now to FIG. 1, FIG. 1 illustrates a cross-sectional view depicting a substrate 110 used to form a microcooler device in accordance with at least one embodiment of the present invention. At an initial fabrication stage, a bulk microcooler substrate, such as substrate 110 is provided. As depicted in FIG. 1, substrate 110 is copper. However, it should be appreciated that substrate 110 can be any metal or metal compound (preferably a metal or metal compound that has good thermal conductivity) suitable for forming a microcooler device.

Figure 2:
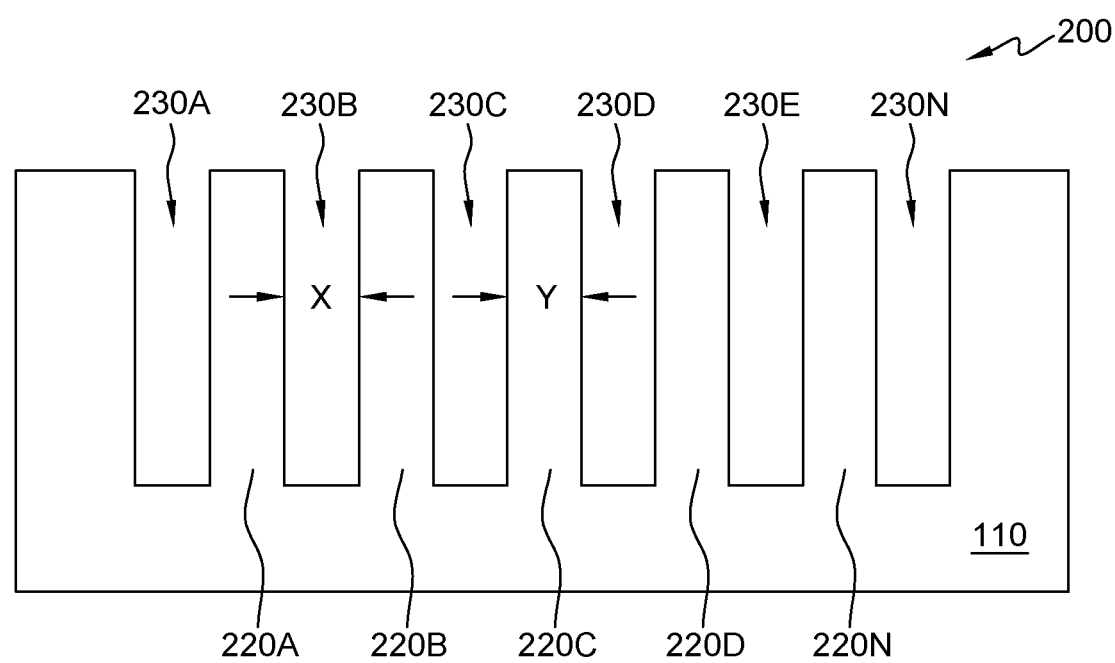
FIG. 2 illustrates a cross-sectional view of the structure depicted in FIG. 1 after subsequent processing steps, generally designated 200, in accordance with at least one embodiment of the present invention.

FIG. 2 illustrates a cross-sectional view depicting formation of a first set of fins 220A-220N and a first set of channels 230A-230N within substrate 110, generally designated 200, in accordance with at least one embodiment of the present invention. First set of fins 220A-220N may be formed within substrate 110 by any known material removal techniques. For example, a mask may be formed upon the upper surface of substrate 110. The mask may be patterned to expose underlying portions of substrate 110 while protecting other underlying portions of substrate 110. The exposed portions of substrate 110 are removed (e.g., via micromachining, wet, and/or dry etching) and the protected portions of substrate 110 are retained to form first set of fins 220A-220N. Subsequently, the mask is removed from first set of fins 220A-220N. The corresponding areas of substrate 110 removed to form first set of fins 220A-220N also results in the formation of first set of channels 230A-230N between first set of fins 220A-220N, respectively.

As depicted in FIG. 2, first set of fins 220A-220N are shaped as longitudinal rectangular shaped fins. However, it should be appreciated that in other embodiments of the present invention, first set of fins 220A-220N can be formed having any known type of fin shape including, but not limited to, pin-shaped fins, trapezoidal-shaped fins, and diamond-shaped fins. Additionally, it should be appreciated that first set of fins 220A-220N can include any number of fins, and first set of channels 230A-230N can include any number of channels.

First set of fins 220A-220N and first set of channels 230A-230N are formed from substrate 110. Accordingly, first set of fins 220A-220N and first set of channels 230A-230N are formed from the same material. As depicted in FIG. 2, substrate 110 is copper. Accordingly, first set of fins 220A-220N and first set of channels 230A-230N formed from substrate 110 are also copper. However, it should be appreciated that substrate 110 (and thus first set of fins 220A-220N and first set of channels 230A-230N formed from substrate 110) can be any type of metal or metal compound (preferably one that has good thermal conductivity) suitable for forming microcooler fins and channels.

In an embodiment, an initial width (X) of first set of channels 230A-230N is 150 um and a width (Y) of first set of fins is 150 um. In an embodiment, the initial width (X) of first set of channels is 250 um and a width (Y) of first set of fins is 150 um. In an embodiment, the width (X) of first set of channels are greater than or equal to 150 um and less than or equal to 250 um. In an embodiment the width (Y) of first set of channels is greater than or equal to 150 um and less than or equal to 200 um. However, it should be appreciated that embodiments of the present invention are not limited to the previously listed widths (X) of first set of channels 230A-230N and widths (Y) of first set of fins 220A-220N, respectively.

Figure 3:
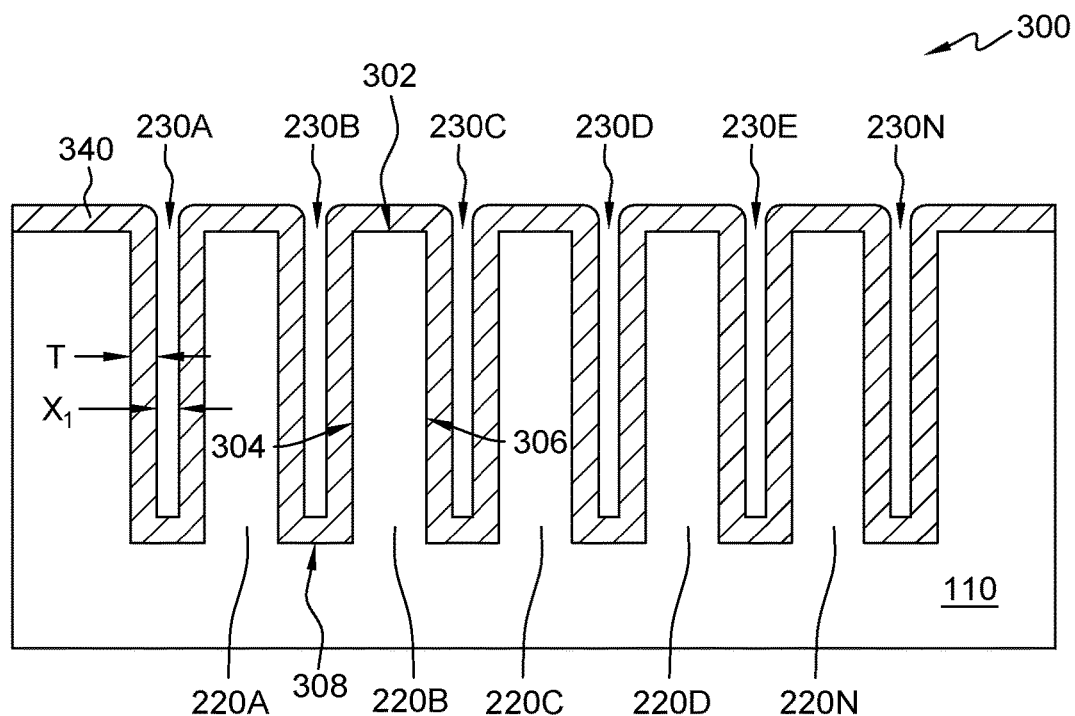
FIG. 3 illustrates a cross-sectional view of the structure depicted in FIG. 2 after subsequent processing steps, generally designated 300, in accordance with at least one embodiment of the present invention.

FIG. 3 illustrates a cross-sectional view of the structure depicted in FIG. 2 after subsequent processing steps, generally designated 300, in accordance with at least one embodiment of the present invention. As depicted in FIG. 3, metal liner layer 340 is formed (e.g., via atomic layer deposition, chemical vapor deposition, plating, electroplating, or any other suitable deposition techniques) on the surfaces of first set of fins 220A-220N and first set of channels 230A-230N, respectively. Specifically, metal liner layer 340 is formed on a top surface 302, a first sidewall surface 304, and a second sidewall surface 306 of first set of fins 220A-220N, respectively, and on a bottom surface 308 of first set of channels 230A-230N, respectively. In an embodiment, metal liner layer 340 is aluminum (Al) or nickel (Ni). In an embodiment, substrate 110 is copper and metal liner layer 340 is aluminum. In an embodiment, substrate 110 is copper and metal liner layer 340 is nickel. However, it should be appreciated that metal liner layer 340 can be any known metal or metal compound (preferably one that has good thermal conductivity) that is distinct from the material of substrate 110. For example, if substrate 110 is copper, than metal liner layer 340 can be any metal (preferably one that has good thermal conductivity) other than copper. In another example, if substrate 110 is copper, than metal liner layer 340 can be any type of metal compound (preferably one that has good thermal conductivity) that does not include copper.

The formation of metal liner layer 340 on the surfaces of first set of fins 220A-220N results in the formation of a composite fin formed from the materials of substrate 110 and metal liner layer 340. In an embodiment, first set of fins 220A-220N are composite fins formed from a first metal (e.g., substrate 110) and a second, different metal (e.g., metal liner layer 340). For example, if substrate 110 is copper and metal liner layer 340 is aluminum, then first set of fins 220A-220N are formed as a copper and aluminum composite fin. In an embodiment, if substrate 110 is copper and metal liner layer 340 is nickel, then first set of fins 220A-220N are formed as a copper and nickel composite fin. It should be appreciated that by depositing metal liner layer 340 on the surfaces of first set of fins 220A-220N, a copper microcooler having narrower channel widths than what is possible using current micromachining techniques is achieved.

In an embodiment, the thickness (T) of metal liner layer 340 deposited onto top surface 302, first sidewall surface 304, and second sidewall surface 306 of first set of fins 220A-220N to form a composite fin is based, at least in part, on: (i) the initial channel width (X) of first set of channels 230A-230N, and (ii) a predetermined final channel width (X') of first set of channels 230A-230N, respectively.

For example, in an embodiment, the initial channel width (X) of first set of channels 230A-230N is 200 micrometers (um). Accordingly, if a predetermined final channel width (X') of 100 um is required, then 50 um of metal liner layer 340 is deposited onto first sidewall surface 304 and second sidewall surface 306 of first set of fins 220A-220N, respectively, to achieve a predetermined final channel width (X') of 100 um. However, it should be appreciated that embodiments of the present invention are not limited to these dimensions.

Figure 4:
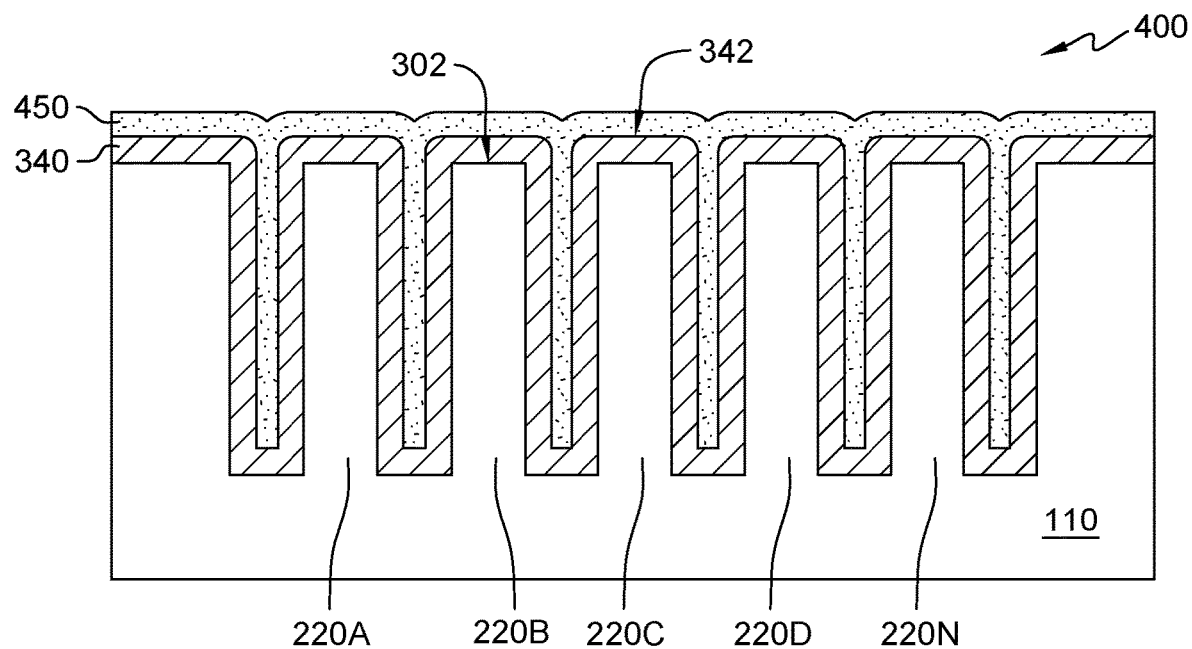
FIG. 4 illustrates a cross-sectional view of the structure depicted in FIG. 3 after subsequent processing steps, generally designated 400, in accordance with at least one embodiment of the present invention.

FIG. 4 illustrates a cross-sectional view of the structure depicted in FIG. 3 after subsequent processing steps, generally designated 400, in accordance with at least one embodiment of the present invention. As depicted in FIG. 4, metal filler layer 450 is formed (e.g., via atomic layer deposition, chemical vapor deposition, plating, electroplating, or any other suitable deposition techniques) on the exposed surfaces of metal liner layer 340. Specifically, metal filler layer 450 is formed such that first set of channels 230A-230N are filled with metal filler layer 450 until metal filler layer 450 is at least substantially coplanar with top surface 302 of first set of fins 220A-220N. As depicted in FIG. 4, metal filler layer 450 is copper. However, it should be appreciated that metal filler layer 450 may be any metal or metallic compound (preferably one that has good thermal conductivity) that is different than metal liner layer 340. In an embodiment, metal liner layer 340 is aluminum and metal filler layer 450 is copper. In an embodiment, metal liner layer 340 is nickel and metal filler layer 450 is copper.

In an embodiment, metal filler layer 450 is formed within and filling first set of channels 230A-230N by depositing a metal or metal compound (preferably one that has good thermal conductivity) that is different than metal liner layer 340, followed by a thermal annealing. For example, the thermal annealing can be a furnace anneal, rapid thermal anneal, flash anneal, or laser anneal. In an embodiment, for furnace anneal and rapid thermal anneal, the annealing temperature can range from 150° C. to 450° C. for furnace anneal and rapid thermal anneal and the anneal duration can range from 10 minutes to one hour. In an embodiment, for flash anneal/laser anneal, the annealing temperature can be higher (e.g., from 450° C. to 1000° C.), but the anneal duration is much shorter (e.g., ranging from 100 nanoseconds to 100 milliseconds).

Figure 5:
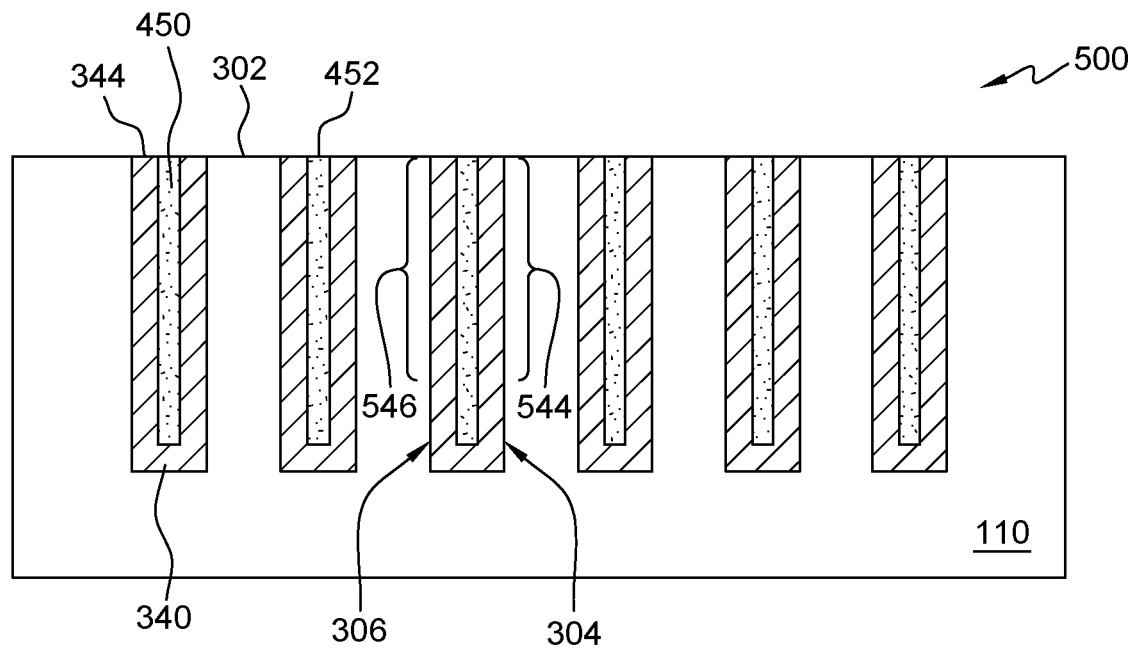
FIG. 5 illustrates a cross-sectional view of the structure depicted in FIG. 4 after subsequent processing steps, generally designated 500, in accordance with at least one embodiment of the present invention.

FIG. 5 illustrates a cross-sectional view of the structure depicted in FIG. 4 after subsequent processing steps, generally designated 500, in accordance with at least one embodiment of the present invention. As depicted in FIG. 5, any excess of metal filler layer 450 formed on a top surface 342 of metal liner layer 340 (depicted in FIG. 4) and metal liner layer 340 formed on top surface 302 of first set of fins 220A-220N (depicted in FIG. 4) has been removed (e.g., via chemical mechanical planarization (CMP) or "polishing", or any other suitable material removal techniques) until top surface 302 of first set of fins 220A-220N is exposed. As depicted in FIG. 5, a top surface 344 of metal liner layer 340 and a top surface 452 of metal filler layer 450 are now substantially coplanar with top surface 302 of first set of fins 220A-220N.

Figure 6:
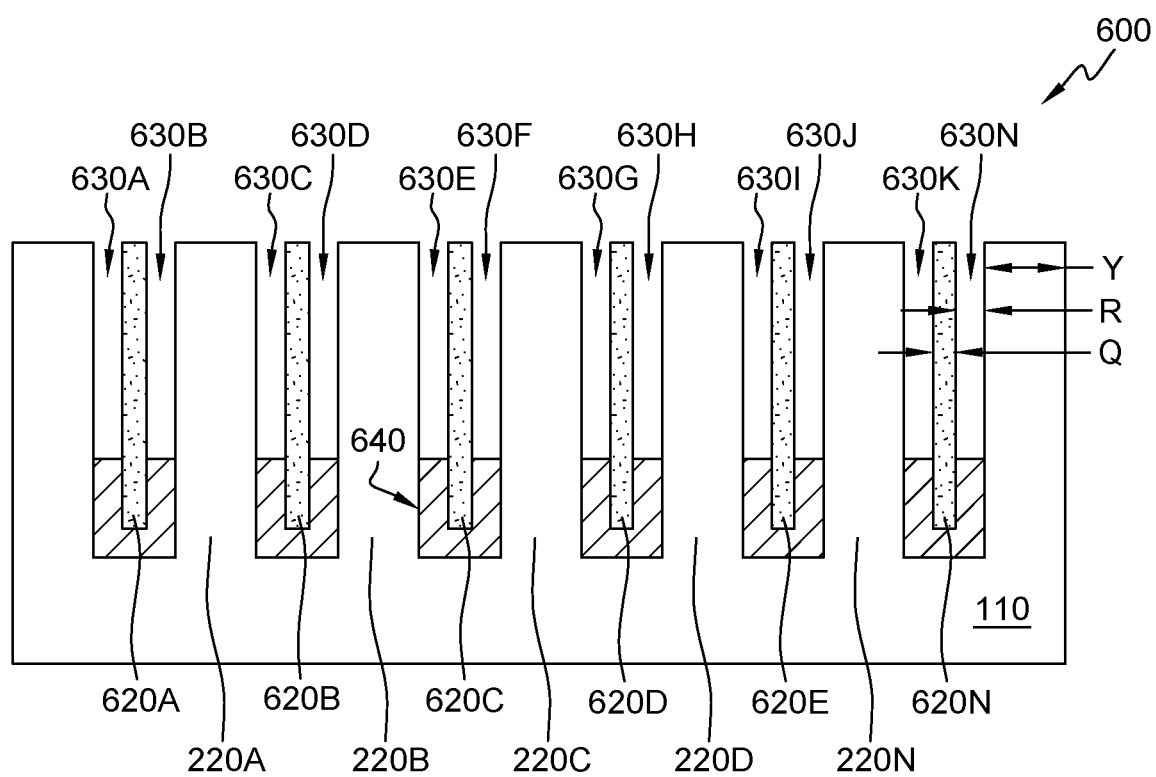
FIG. 6 illustrates a cross-sectional view of the structure depicted in FIG. 5 after subsequent processing steps, generally designated 600, in accordance with at least one embodiment of the present invention.

FIG. 6 illustrates a cross-sectional view of the structure depicted in FIG. 5 after subsequent processing steps, generally designated 600, in accordance with at least one embodiment of the present invention. As depicted in FIG. 6, a second set of fins 620A-620N and a second set of channels 630A-630N are formed by removing (e.g., via selective etching or any other suitable material removal techniques) a first portion 544 (depicted in FIG. 5) of metal liner layer 340 deposited on first sidewall surface 304 and a second portion 546 (depicted in FIG. 5) of metal liner layer 340 deposited on second sidewall surface 306 of first set of fins 220A-220N, respectively. It should be noted that second set of fins 620A-620N correspond to metal filler layer 450 formed on metal liner layer 340 within and filling first set of channels 230A-230N. Accordingly, second set of fins 620A-620A are formed from the same material as metal filler layer 450.

As depicted in FIG. 6, second set of fins 620A-620N are shaped as longitudinal rectangular shaped fins. However, it should be appreciated that in other embodiments of the present invention, second set of fins 620A-620N can be formed having any known type of fin shape, including, but not limited to, pin-shaped fins, trapezoidal-shaped fins, and diamond-shaped fins. Additionally, it should be appreciated that second set of fins 620A-620N can include any number of fins, and second set of channels 630A-630N can include any number of channels.

In an embodiment, first portion 544 and second portion 546 of metal liner layer 340 is removed via a piranha solution (i.e., piranha etch). For example, if metal liner layer 340 is aluminum, and first set of fins 220A-220N and second set of fins 620A-620N are copper, an etch rate of aluminum and copper when subjected to a piranha solution is >5200 nm/min and 88 nm/min, respectively. In other words, the piranha solution will remove first portion 544 and second portion 546 of metal liner layer 340 (formed from aluminum) at a rate that is approximately sixty times faster than the rate at which the piranha solution will remove first set of fins 220A-220N (formed from copper) and second set of fins 630A-603N (formed from copper). In another example, if metal liner layer 340 is nickel, and first set of fins 220A-220N and second set of fins 620A-620N are copper, an etch rate of nickel when subjected to a piranha solution is 380 nm/min and 88 nm/min, respectively. In other words, the piranha solution will remove metal liner layer 340 (formed from nickel) at a rate that is approximately four times faster than the rate at which the piranha solution will remove first set of fins 220A-220N (formed from copper) and second set of fins 630A-630N (formed from copper). However, it should be appreciated that embodiments of the present invention are not limited to selective etching via a piranha solution, and that any other suitable material removal techniques known in the art may be used to selectively remove first portion 544 and second portion 546 of metal liner layer 340.

The remaining bottom portion of metal liner layer 340 forms a spacer 640. As depicted in FIG. 6, spacer 640 is located at a bottom portion of second set of channels 630A-630N. Spacer 640 separates first set of fins 220A-220N from second set of fins 620A-620N. It should be appreciated that spacer 640 adds structural support to second set of fins 220A-220N.

In an embodiment, the thickness (T) of metal liner layer 340 (depicted in FIG. 3) previously deposited onto first sidewall surface 304 and second sidewall surface 306 of fins 220A-220N (as previously described above with reference to FIG. 3) is based, at least in part, on: (i) an initial channel width (X) of channels 230A-N (depicted in FIG. 2), (ii) a predetermined fin width (Q) of fins 620A-620N formed within channels 630A-N and alternating between fins 220A-N, respectively, and (iii) a predetermined channel width (R) for channels 630A-630N formed between fins 220A-220N and fins 620A-620N, respectively.

For example, assume that the initial channel width (X) of first set of channels 230A-230N is 250 um. Accordingly, if a predetermined fin width (Q) of 50 um is required for fins 620A-620N and a predetermined channel width (R) of 100 um is required for second set of channels 630A-630N, then 100 um of metal liner layer 340 is deposited onto first sidewall surface 304 and second sidewall surface 306 (depicted in FIG. 3) of first set of fins 220A-220N, respectively, to achieve a predetermined fin width (Q) of 50 um for second set of fins 620A-620N and a predetermined channel width (R) of 100 um for second set of channels 630A-630N. First portion 544 and second portion 546 of metal liner layer 340 (depicted in FIG. 5) is then removed to form second set of fins 620A-620N having fin width (Q) of 50 um and second set of channels 630A-630N having a channel width (R) of 100 um.

According to one embodiment of the present invention, a method of forming a microcooler device is provided, the method comprising: forming a first set of fins in a copper substrate, wherein forming the first set of fins in the copper substrate further results in forming a first set of channels located between the first set of fins; and forming a second set of fins in the first set of channels, wherein the first set of fins have a first fin width, and the second set of fins have a second fin width.

In an embodiment, the first set of fins and the first set of channels are formed in the copper substrate via micromachining.

In an embodiment, the method further includes forming the second set of fins in the first set of channels further includes forming a metal liner layer along a surface of the first set of channels, wherein the metal liner layer is an alternative to copper.

In an embodiment, the method further includes forming a metal fill layer on the metal liner layer to fill the first set of channels, wherein the metal fill layer is copper.

In an embodiment, the method further includes removing a top portion of the metal liner layer.

In an embodiment, the metal liner layer is formed along a surface of the first set of channels via electroplating.

In an embodiment, the metal liner layer is aluminum or nickel.

In an embodiment, the metal liner layer is copper.

In an embodiment, forming the second set of fins within the first set of channels further results in forming a second set of channels located between the first set of fins and the second set of fins.

In an embodiment, the second set of channels formed between the first set of fins and the second set of fins have a channel width that is narrower than a channel width of the first set of channels.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A microcooler device, comprising:
   a first set of fins having a first fin width;
   a second set of fins having a second fin width, wherein the first set of fins alternate between the second set of fins;
   a metal spacer formed along a portion of sidewalls of each fin in the second set of fins; and
   a set of channels located between the first set of fins and the second set of fins, and entirely above the metal spacer,
   wherein a spacer width of the metal spacer is equal to a channel width of the set of channels.

2. The microcooler device of claim 1, wherein the metal spacer separates the first set of fins from the second set of fins.

3. The microcooler device of claim 1, wherein the first set of fins and the second set of fins are copper.

4. The microcooler device of claim 1, wherein the first set of fins are copper, and the second set of fins are an alternative to copper.

5. The microcooler device of claim 1, wherein the metal spacer is an alterative to copper.

6. The microcooler device of claim 1, wherein the metal spacer is aluminum or nickel.

7. The microcooler device of claim 1, wherein the channel width of the set of channels is less than the first fin width of the first set of fins, and greater than the second fin width of the second set of fins.

8. The microcooler device of claim 1, wherein the channel width of the set of channels located between the first set of fins and the second set of fins is 100 micrometers.

9. The microcooler device of claim 1, wherein:
   the first fin width of the first set of fins is $\geq 150$ micrometers and $\leq 200$ micrometers; and
   the second fin width of the second set of fins is 50 micrometers.

10. A method of forming a microcooler, comprising:
    forming a first set of fins having a first fin width and a first set of channels located between the first set of fins; and
    forming a second set of fins having a second fin width that alternate between the first set of fins, wherein forming the second set of fins includes:
    forming metal spacers along sidewalls of the first set of fins;
    forming a metal fill layer in the first set of channels; and
    removing a top portion of the metal spacers.

11. The method of claim 10, wherein the first set of fins and the first set of channels are formed from a metal substrate via micromachining.

12. The method of claim 10, wherein the metal spacers are formed via electroplating.

13. The method of claim 10, wherein the metal spacers are aluminum or nickel.

14. The method of claim 10, wherein the metal fill layer is copper.

15. The method of claim 10, wherein removing the top portion of the metal spacers further results in a second set of channels located between the first set of fins and the second set of fins, and entirely above the metal spacers.

16. The method of claim 15, wherein the second set of channels located between the first set of fins and the second set of fins, and entirely above the metal spacers have a channel width that is narrower than a channel width of the first set of channels initially formed between the first set of fins.

* * * * *